United States Patent [19]

Ayasli

[11] Patent Number: 4,733,203
[45] Date of Patent: Mar. 22, 1988

[54] PASSIVE PHASE SHIFTER HAVING SWITCHABLE FILTER PATHS TO PROVIDE SELECTABLE PHASE SHIFT

[75] Inventor: Yalcin Ayasli, Lexington, Mass.

[73] Assignee: Raytheon Company, Lexington, Mass.

[21] Appl. No.: 588,591

[22] Filed: Mar. 12, 1984

[51] Int. Cl.$^4$ .............................................. H03H 7/19
[52] U.S. Cl. ...................................... 333/139; 333/164;
333/103; 333/129; 333/132; 307/571; 307/242;
307/248
[58] Field of Search ................ 333/164, 161, 156, 246,
333/247, 101, 103, 104, 127, 118, 125, 126, 129,
132, 134, 138, 139; 307/239, 241, 242, 243, 244,
248, 249, 571, 581, 582

[56] References Cited

U.S. PATENT DOCUMENTS

| | | | |
|---|---|---|---|
| 3,319,088 | 5/1967 | Payne ................................... | 307/242 |
| 3,446,989 | 5/1969 | Allen et al. ...................... | 307/248 X |
| 3,515,905 | 6/1976 | Roper .............................. | 307/249 X |
| 3,718,873 | 2/1973 | Garver ................................. | 333/164 |
| 4,435,841 | 3/1984 | Dobrovolny .................... | 333/103 X |

OTHER PUBLICATIONS

Lynes Coy et al; "Design of Broadband 4-Bit Loaded Switched Line Phase Shifter"; *IEEE Transaction on Microwave Theory and Technique;* vol. MTT-22, No. 6, Jun. 1974; pp. 603-607.

Primary Examiner—Eugene R. Laroche
Assistant Examiner—Benny T. Lee
Attorney, Agent, or Firm—Denis G. Maloney; Richard M. Sharkansky

[57] ABSTRACT

A network is provided which is selectively configurable as a high pass and low pass filter. A pair of sets of field effect transistors FETS is provided, each set comprising three FETS connected in a T-configuration. A pair of the FETS in each set have a drain electrode of one FET coupled to the source electrode of the other FET to provide a series element of the T-configured set. The third FET has drain and source electrodes coupled between the common connection of the pair of FETS and ground to form a shunt element of the T-configured set. The gate electrodes of the series elements of a first one of the sets of FETS and the shunt element of the other set of the FETS are each fed a common control voltage signal. A first one of the sets of FETS is capacitively coupled between the input and output terminals of the network, and the second one of the set of FETS is inductively coupled between the input and output terminals of the network. One of a pair of complementary control signals is fed to each one of the gate electrodes of the FETS, and in response to a first state of said pair of control signals, the network is configured to provide a low pass filter having a first predetermined phase shift characteristic as a function of frequency over a predetermined operating frequency range. In response to a second, different set of said control signals, the network is reconfigured to provide a high pass filter section having a second, different predetermined phase shift characteristic as a function of frequency range. The difference in phase characteristics of the network configured as a low pass filter and a high pass filter is provided to be substantially constant over the predetermined frequency range, thereby providing a single phase shift bit.

15 Claims, 7 Drawing Figures

PASSIVE PHASE SHIFTER HAVING SWITCHABLE FILTER PATHS TO PROVIDE SELECTABLE PHASE SHIFT

BACKGROUND OF THE INVENTION

This invention relates generally to radio frequency circuits and more particularly to radio frequency circuits which provide a selective phase shift to a signal propagating therethrough.

As is known in the art, phase shifter circuits are employed in various radio frequency (r.f.) applications such as phased array antenna systems. One type of phase shifter, a passive phase shifter 10 is shown in FIG. 1 and includes passive elements which provide a phase lag and a phase lead network and includes a pair of signal paths provided between an input terminal RF IN and an output terminal RF OUT with the upper one of the signal paths being through a high pass filter 14 to provide phase lead or positive phase shift to a signal and the lower one of the signal paths being through a low pass filter 18 to provide phase lag or negative phase shift to a signal. Typically, a pair of switches 12, 16 are used to couple a signal between the input and output terminals through a selected one of said filter networks. Often, a pair of field effect transistors are arranged to provide active switching elements of each one of said switches. Field effect transistors are employed in these applications because they are easily formed as part of monolithic integrated circuits unlike other types of active switching devices such as pin diodes. A problem with the approach shown in FIG. 1 is that the input RF signal coupled between the input terminal and the output terminal first passes through the input switch 12 and thus a selected one of the input switching field effect transistors thereof, a first selected one of the high and low pass filter sections, and the output switch 16 and thus a selected one of the output switching field effect transistors before reaching the output terminal. That is, the input signal is cascaded through an input switching field effect transistor, a selected filter section and an output switching field effect transistor. Since each one of said field effect transistors has a finite bandwidth, the overall bandwidth of the circuit will be less than the intrinsic bandwidth of the filter section alone.

An additional problem with this approach is that in the "off state" field effect transistors generally have a very large drain-source capacitance which permits a portion of the input signal to be coupled between the input and output terminals through the "unselected" filter section. This generally causes phase distortion in the output signal. Generally, therefore, this large capacitance must be compensated for by tuning or resonating the capacitance. However, this solution generally reduces the bandwidth of the phase shifter from that of the theoretical bandwidth of the passive network.

Further, with this approach, impedance matching networks (not shown) are generally required at the input and output of each FET. This results in a loss in bandwidth, increased insertion loss and increased complexity and size of the phase shifter circuit.

SUMMARY OF THE INVENTION

In accordance with the present invention, two sets of field effect transistors is provided, each set of field effect transistors comprising three field effect transistors connected in a T-configuration. Two of the field effect transistors in each set has a drain electrode of one transistor coupled to a source electrode of the other transistor to provide a series element of the T-configured set. The third transistor has a first one of the drain and source electrodes coupled to the common connection of the pair of transistors and the second one of drain and source electrodes coupled to ground to form a shunt element of the T-configured set. The series element of a first one of the sets of field effect transistors is capacitively coupled between input and output terminals of the network, and the series element of the second set of field effect transistors is inductively coupled between the input and output terminals of the network. One of a pair of complementary control signals is fed to each one of the gate electrodes of each field effect transistor. Gate electrodes of the series element of a first one of the sets of field effect transistors and the gate electrode of the shunt element of the other one of the pair of sets of field effect transistors are each fed the same one of the pair of complementary control voltage signals. In response to a first state of said pair of control signals, the network is configured to provide a low pass filter having a first phase shift characteristic as a function of frequency over a predetermined operating frequency range. In response to a second, different state of said set of control signals, the network is reconfigured to provide a high pass filter section having a second, different predetermined phase shift characteristic as a function of frequency over a predetermined operating frequency range. The difference in phase characteristic of the network configured as a low pass filter and as a high pass filter is provided to be relatively constant over the predetermined frequency range. With this arrangement, a phase shift bit having a relatively constant phase shift over the predetermined frequency range is provided. Further, by providing the field effect transistors in two sets of T-configured transistors, the external switching circuits are eliminated and concomitant loss in bandwidth generally associated with such external switches in passive phase shifters is substantially reduced. Further, the capacitance in the "off state" of the field effect transistors becomes part of the phase shift network eliminating tuning circuitry also associated with external switching. Further still, by eliminating the external switches, at least one impedance matching network is eliminated at the input and output of the phase shifter.

BRIEF DESCRIPTION OF THE DRAWINGS

The foregoing features of this invention, as well as the invention itself, may be more fully understood from the following detailed description of the drawings, in which.

DESCRIPTION OF THE PREFERRED EMBODIMENT

Figure 2:
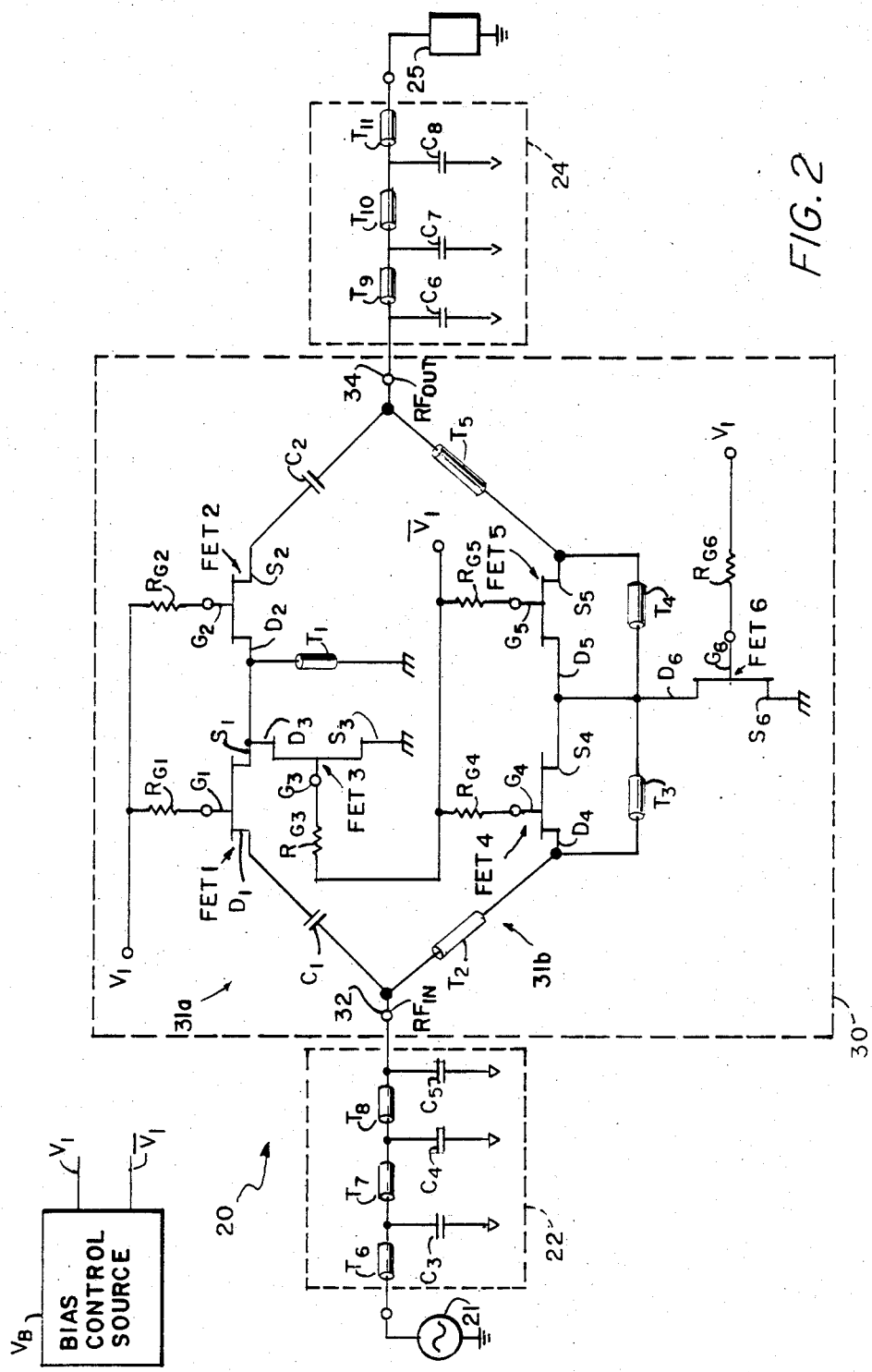
FIG. 2 is a schematic diagram of a phase shifter having a reconfigurable phase shift network in accordance with the present invention.

Referring now to FIG. 2, a phase shifter 20 is shown to include a reconfigurable network 30. The reconfigurable network 30 is coupled between an input impedance matching network 22 and an output impedance matching network 24. The reconfigurable network 30 includes a plurality of here six field effect transistors, FET 1 to FET 6, each field effect transistor having drain electrodes $D_1$ to $D_6$, source electrodes $S_1$ to $D_6$ and gate electrodes $G_1$ to $G_6$, respectively. Each one of the field effect transistors FET 1 to FET 6 is connected in a resistive switching mode, that is, one of a pair of complementary bias signals is applied to the gate electrodes $G_1$ to $G_6$ of FET 1 to FET 6 to bias the gate electrode and to change the impedance between the drain and source electrodes of the respective FET. The drain electrodes $D_1$ to $D_6$ and source electrodes $S_1$ to $S_6$, however, are left unbiased. In this manner, the FET provides in response to the gate bias signal applied to the gate electrode, a relatively high impedance between source and drain electrodes in response to a first state of such signal, or alternatively, a relatively low impedance between source and drain electrodes in response to a second, different state of such bias signal. Network 30 includes a pair of terminals, an input terminal 32 ($RF_{IN}$) and an output terminal 34 ($RF_{OUT}$). A pair of electrical signal paths 31a, 31b are provided to electrically couple terminals 32 and 34. Electrical signal path 31a includes a capacitor $C_1$ coupled at a first end to terminal 32, and further includes FET 1 and FET 2 and a capacitor $C_2$ serially coupled together between the second end of capacitor $C_1$ and terminal 34. That is, the drain electrode $D_1$ of field effect transistor FET 1 is coupled to the second end of capacitor $C_1$, source electrode $S_1$ of FET 1 is coupled to drain electrode $D_2$ of FET 2, and source electrode $S_2$ of FET 2 is coupled to a first end of the capacitor $C_2$ with the second end of capacitor $C_2$ being coupled to output terminal 34. The electrical signal path 31a also includes a first shunt path having FET 3 with drain $D_3$ and source $S_3$ electrodes coupled between the common connection of FET 1, FET 2 and a common reference potential, here ground. Therefore, FET 1, FET 2 and FET 3 are arranged in a first T-section with FET 1, FET 2 coupled in series and FET 3 coupled in shunt between the common connection of FET 1, FET 2 and ground. A second shunt path having a section of transmission line $T_1$ with a predetermined inductance per unit length is provided between the common connection of FET 1 and FET 2 and ground, as shown.

Electrical signal path 31b includes a transmission line $T_2$ having a predetermined inductance per unit length coupled between terminal 32 and drain electrode $D_4$ of FET 4. FET 4, FET 5 and FET 6 are similarly arranged in a T-section configuration with FET 4 and FET 5 coupled in series, and FET 6 coupled in shunt between the common interconnection of FET 4 and FET 5 and ground, as shown. Further, FET 4 and FET 5 are each connected in shunt across one of a pair of transmission line sections $T_3$ and $T_4$, each having a predetermined inductance per unit length, as shown. A transmission line section $T_5$ having a predetermined inductance per unit length is coupled between output terminal 34 and the interconnection of transmission line section $T_4$ and source electrode $S_5$ of FET 5, as shown.

The input impedance matching circuit 22 is here a ladder network having three shunt paths to ground through capacitors $C_3$, $C_4$ and $C_5$, with transmission lines $T_6$, $T_7$ and $T_8$ forming series inductive elements of such ladder network. The input impedance matching circuit 22 is adapted for coupling to an input source 21 of radio frequency energy ($V_s$). Similarly, the output impedance matching circuit 24 is a ladder network having three shunt paths to ground, here via capacitors $C_6$, $C_7$ and $C_8$, with transmission lines $T_9$, $T_{10}$ and $T_{11}$ here forming the series inductive elements of such ladder network. The output matching circuit is adaptable for coupling to a load 25. All of the transmission line sections $T_1-T_{11}$ are here microstrip type transmission lines. Each one of such microstrip transmission lines is selected to provide a predetermined inductive reactance, as is known in the art.

Gate electrodes $G_1-G_6$ of FET 1-FET 6 are each fed by one of a pair of complementary control signals provided on lines $V_1$, $\overline{V}_1$ from a bias control source $V_B$. Gate electrodes $G_1$, $G_2$ and $G_6$ are coupled through corresponding ones of gate bias resistors $R_{G1}$, $R_{G2}$, $R_{G6}$ to the control signal line $V_1$. A control signal on line $V_1$ selectively places FET 1, FET 2 and FET 6 in an "on" or in a relatively low impedance state between corresponding drain and source electrodes in response to a first state of such signal or alternatively places FET 1, FET 2 and FET 6 in a "pinch-off" or in a relatively high impedance state in response to a second, different state of the control signal. The gate electrodes $G_3$, $G_4$ and $G_5$ of FET 3, FET 4 and FET 5, respectively, are coupled through resistors $R_{G3}$, $R_{G4}$, $R_{G5}$ to the bias control signal line $\overline{V}_1$. Similarly, in response to complementary control signal $\overline{V}_1$, FET 3 to FET 5 are placed either in an "on" or a relatively low impedance state or a "pinch-off" or a relatively high impedance state, as described above. Operation of the phase shifter 20 will now be described in conjunction with FIGS. 3-7.

Figure 3:
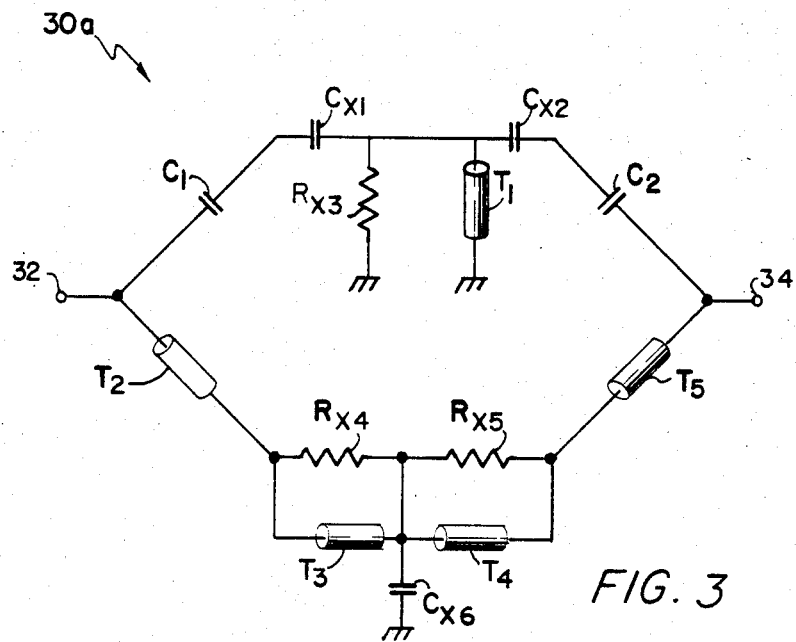
FIG. 3 is an equivalent circuit of the phase shift network of FIG. 2 provided in response to a first state of a pair of control signals fed to the network.
Figure 4:
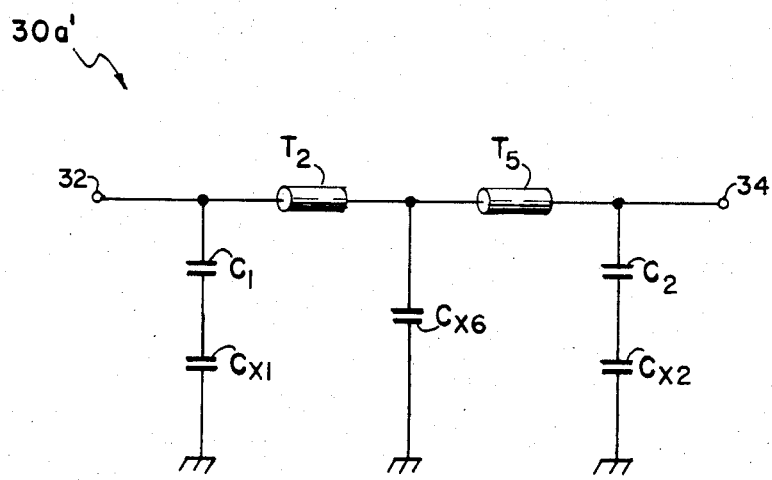
FIG. 4 is a simplified equivalent circuit of FIG. 3.

Referring now to FIGS. 3 and 4, an equivalent circuit 30a (FIG. 3) of phase shift section 30 (FIG. 2) is shown. This configuration 30a of network 30 (FIG. 2) is provided by feeding a signal on bias control signal line $V_1$ to gate electrodes $G_1$, $G_2$ and $G_6$ to switch the corresponding FET 1, FET 2 and FET 6 into an "off" or a relatively high impedance state. In such state, FET 1, FET 2 and FET 6 are represented by capacitors $C_{X1}$, $C_{X2}$, and $C_{X6}$ having a relatively low capacitance and hence a relatively high impedance over the operating frequency band. Conversely, a signal is fed on control line $\overline{V}_1$ to gate electrodes $G_3$ to $G_5$ of FET 3 to FET 5 to place FET 3 to FET 5 in an "on" or a relatively low impedance state. In such state, FET 3 to FET 5 are represented by resistors $R_{X3}$ to $R_{X5}$. The equivalent resistance of FET 3-FET 5 represented by resistors $R_{X3}$ to $R_{X5}$ are relatively low in impedance (approximately equal to 0 ohms), and equivalent capacitors $C_{X1}$, $C_{X2}$ and $C_{X3}$ are of relatively low capacitance such that the reactance of $C_{X1}$, $C_{X2}$, and $C_{X3}$ are of a relatively high impedance at the frequency of the input signal. Therefore, the equivalent circuit 30a of FIG. 3 may be simplified to an equivalent circuit 30a' as shown in FIG. 4. That is, resistor $R_{X3}$ will provide a low impedance path to ground, substantially shorting out transmission line $T_1$, and providing a first shunt path to ground through series connected capacitors $C_1$ and $C_{X1}$, and a second shunt path to ground through series connected capacitors $C_2$ and $C_{X2}$. On the other hand, resistors $R_{X4}$ and $R_{X5}$ will provide relatively low impedance paths (approximately equal to 0 ohms) across transmission line sections $T_3$ and $T_4$, thereby providing a relatively low impedance path between transmission line $T_2$ and transmission line $T_5$, as shown. A third shunt path to ground is provided by capacitor $C_{X6}$ as shown in FIG. 4. The equivalent circuit $30a'$ as shown in FIG. 4 is that of a five element low pass filter. By properly selecting the values of capacitance of $C_1$ and $C_2$, the capacitance values of the equivalent capacitance of the FETS $C_{X1}$, $C_{X2}$ and $C_{X6}$, and the inductances provided by transmission line section $T_2$ and $T_5$, a low pass filter section providing a first predetermined phase variation with respect to frequency is provided, such as shown in FIG. 7, curve 44.

Figure 5:
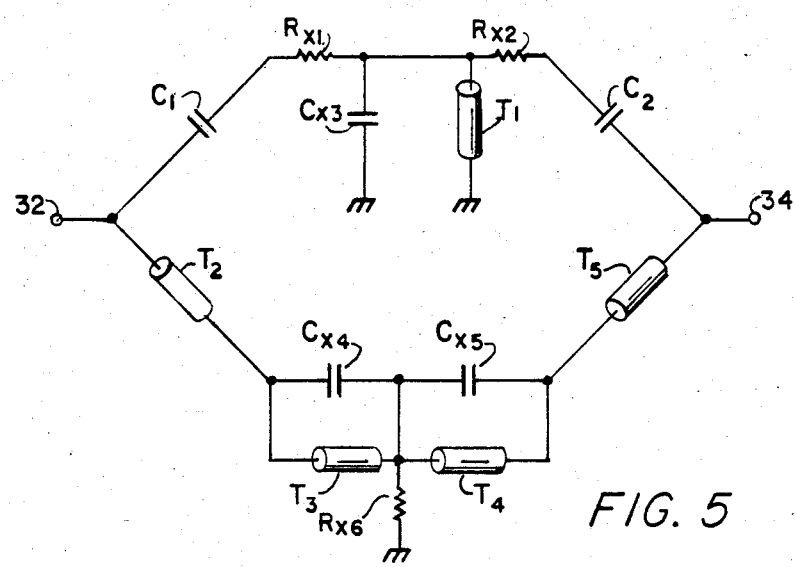
FIG. 5 is a second equivalent circuit of the phase shift network of FIG. 2 provided in response to a second, different state of the pair of control signals.
Figure 6:
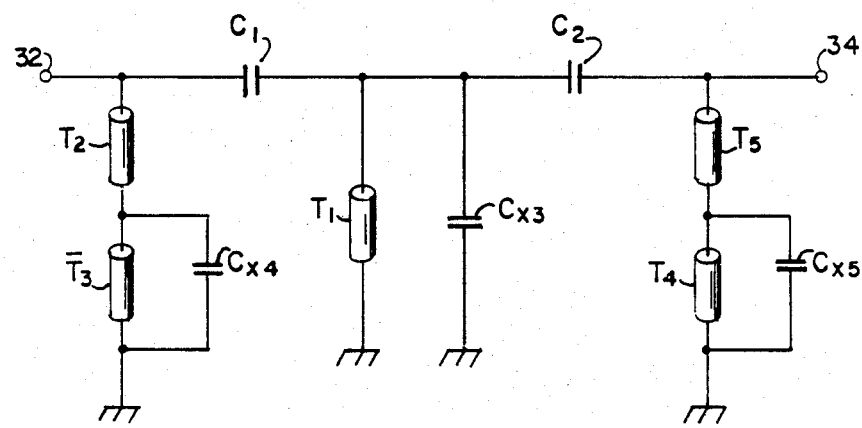
FIG. 6 is a simplified equivalent circuit of FIG. 5.

Referring now to FIGS. 5 and 6, an equivalent circuit $30b$ of the phase shift network 30 is shown. This configuration $30b$ of network 30 (FIG. 2) is provided by feeding a signal on control voltage line $V_1$ which places FET 1, FET 2 and FET 6 in an "on" or relatively low impedance state, and by feeding a signal on control voltage line $\overline{V}_1$ which places FET 3, FET 4 and FET 5 in a "pinch-off" or relatively high impedance state. Series coupled field effect transistors FET 1, FET 2 are thus shown replaced by the equivalent resistors $R_{X1}$ and $R_{X2}$ having a relatively low resistance (approximately equal to 0 ohms) and shunt mounted FET 6 is shown replaced by a shunt mounted resistor $R_{X6}$ again having a relatively low resistance (approximately equal to 0 ohms). Further, FET 3 to FET 5 are shown replaced by capacitors $C_{X3}$ to $C_{X5}$. The equivalent circuit $30b$ (FIG. 5) may be simplified to an equivalent circuit $30b'$ shown in FIG. 6. A relatively low impedance path is provided between capacitor $C_1$ and capacitor $C_2$ through resistors $R_{X1}$ and $R_{X2}$. The relatively low impedance of resistor $R_{X6}$ provides relatively low impedance paths to ground for transmission lines $T_3$ and $T_4$. Three shunt paths to ground are thus provided in network $30b'$. A first shunt path includes transmission lines $T_2$ and $T_3$ serially connected together, with capacitor $C_{X4}$ coupled in shunt with transmission line $T_3$. A second shunt path includes transmission line $T_1$, and equivalent capacitor $C_{X3}$ coupled in shunt with transmission line $T_1$, and the third shunt path includes transmission lines $T_4$ and $T_5$ serially connected together with capacitor $C_{X5}$ coupled in shunt with transmission line $T_4$. The equivalent circuit $30b'$ as shown in FIG. 6 is that of a five element high pass filter network which provides a second, predetermined variation in phase as a function of frequency over a predetermined frequency range, as shown in FIG. 7, curve 42.

Accordingly, as FET 1 to FET 6 are arranged to provide the switching functions as indicated in FIGS. 2–6, the two signal paths between input terminal 32 and output terminal 34 of network 30 are configured in response to a first one of a pair of states of control signals $V_1$, $\overline{V}_1$ to provide a high pass filter (network $30b'$) having a first predetermined amount of phase lead with respect to the phase of an input signal as a function of frequency over a predetermined frequency range, and are configured in response to a second, different state of the control signals $V_1$, $\overline{V}_1$ to provide a low pass filter (network $30a'$) having a second, different predetermined amount of phase lag with respect to the phase of an input signal as a function of frequency over a predetermined frequency range. By selecting the values of the capacitors $C_1$, $C_2$ and of transmission line sections $T_1$–$T_5$, and further, by selecting the field effect transistors to have a relatively low resistance (approximately equal to 0 ohms) in the "on" state and a relatively low capacitance in the "off" state, the phase shift network can be provided to have a substantially constant relative phase shift difference between each one of said states over a predetermined operating frequency range. The values of capacitance of the field effect transistors must be selected to be substantially small such that they will provide a relatively high impedance path shunting transmission line sections $T_1$, $T_3$, $T_4$ as shown in FIG. 6, and similarly, the field effect transistors must be selected to provide a relatively low impedance in the "on" state to reduce the resulting insertion loss which otherwise would be provided by the circuit.

Figure 7:
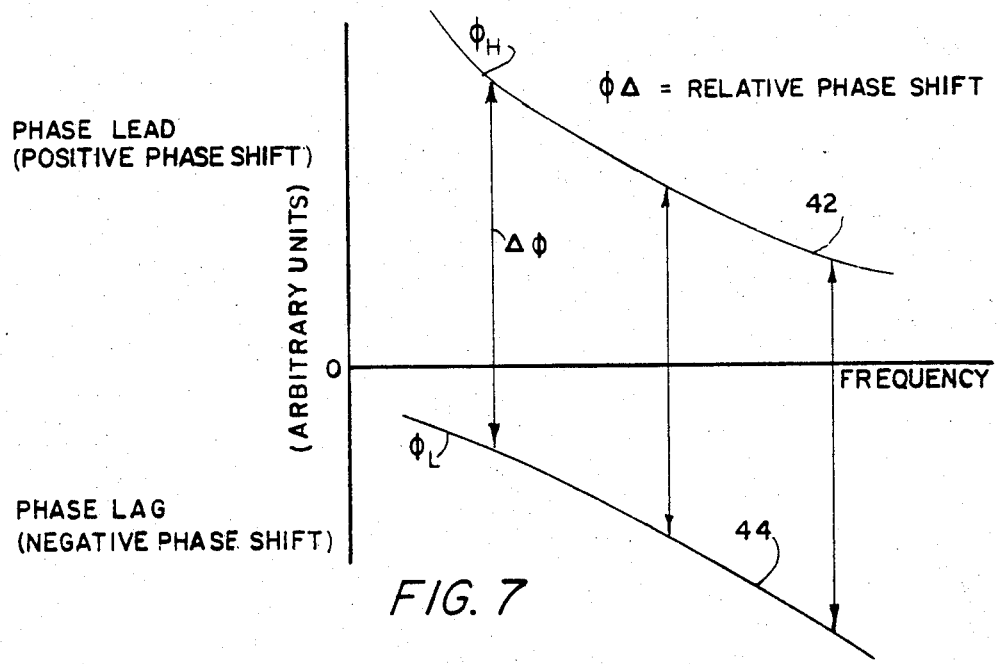
FIG. 7 is a typical plot of the variation of phase with respect to frequency of the phase shifter of FIG. 2 when configured as a high pass filter section and when configured as a low pass filter section.
Figure 1:
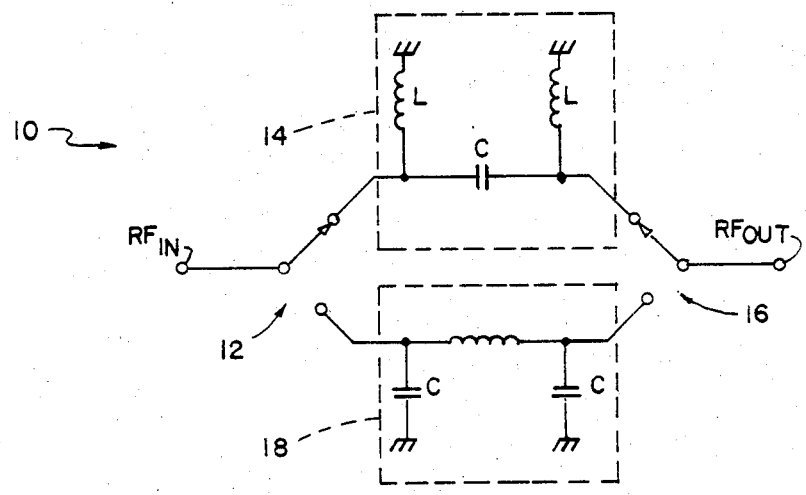
FIG. 1 is a schematic diagram of a typical prior art passive phase shifter having high and low pass filter sections.

Referring now to FIG. 7, a plot of a typical frequency characteristic as a function of frequency for a low pass filter having a predetermined phase lag characteristic 44 over an operating frequency range and a high pass filter having a predetermined phase lead characteristic 42 over the operating frequency range are shown. The difference in the phase of the high pass filter characteristic 42 and the low pass filter characteristic 44 is substantially constant over the operating frequency range. Therefore, while phase as a function of frequency varies in a first predetermined manner for the high pass section, and in a second predetermined manner for the low pass section, the difference in phase represented by $\Delta \phi$ is substantially invariant with changes in frequency over the operating frequency range. By selecting values of capacitance for capacitors $C_1$ and $C_2$, values of equivalent inductance for transmission line sections $T_1$–$T_5$ as well as controlling the value of resistance of FET 1 to FET 6 in the "on" state to be relatively low and the value of capacitance of FET 1 to FET 6 in the "off" state to be relatively low such that the impedance of the equivalent capacitance of FET 1 to FET 6 at the operating frequency is relatively high, the reconfigurable phase shift network is provided which has a relatively high bandwidth approaching the theoretical bandwidth of the passive elements, since the input signal which is shifted in phase is not cascaded through a pair of transistors as in prior passive phase shifters and the reactive component of such FETS, FET 1 to FET 6 become part of the network 30. The phase shift difference $\Delta \phi$ provides a first phase shift bit for a 360° phase shifter, for example. A plurality of such networks may be provided therefore to provide additional phase shift bits such as, but not limited to, 22.5, 45, 90 and 180°. By cascading these stages together, a phase shifter having a selectable phase shift between 0 and 360° is provided.

Further, in accordance with the frequency of the signal as well as the desired phase shift, the values of the components of the network 30 can be selected such that the impedance matching networks 22 and 24 are eliminated.

Further still, it should be appreciated that the phase shifter is preferably fabricated as a monolithic integrated circuit using techniques well-known in the art.

Having described preferred embodiments of the invention, it will now be apparent to one of skill in the art that other embodiments incorporating its concept may be used. It is felt, therefore, that this invention should not be restricted to the disclosed embodiment, but rather should be limited only by the spirit and scope of the appended claims.

What is claimed is:

1. A radio frequency network having an input terminal and an output terminal, and a pair of control signal terminals each fed by one of a pair of control signals with said network comprising:
a first signal path means for capacitively coupling the input terminal to the output terminal;
a second signal path means for inductively coupling the input terminal to the output terminal;
means for connecting to a reference potential the first signal path means and for connecting between the input and output terminals the second signal path means in response to a first state of said control signals to configure said first and second path means as a low pass filter, and for connecting to said reference potential the second path means and for connecting between the input and output terminals the first signal path means in repsonse to a second, different state of said control signals, to configure said first and second path means as a high pass filter; and
wherein the means for connecting said first and second path means comprises:
two sets of transistors with one set respectively disposed in each one of said first and second path means, and each set comprising:
(a) a pair of transistors having drain and source electrodes coupled in series with a first one of the drain and source electrodes of one transistor coupled to a first one of the drain and source electrodes of the other transistor; and
(b) a thrid transistor having drain and source electrodes coupled between the common connection of the pair of transistors and the reference potential.

2. The radio frequency circuit of claim 1 wherein the radio frequency network configured as a low pass filter has a first predetermined phase shift characteristic as a function of frequency over a predetermined frequency range and wherein the radio frequency network configured as a high pass filter has a second, different, predetermined phase shift characteristic as a function of frequency over the predetermined frequency range.

3. The radio frequency circuit of claim 2 wherein the difference in phase between the network configured as a low pass filter and the network configured as a high pass filter is substantially constant over the predetermined frequency range.

4. A radio frequency network having an input terminal and an output terminal comprising:
(a) a first signal path comprising:
(i) a first capacitor having a first end coupled to the input terminal, and a second capacitor having a first end coupled th the output terminal;
(ii) first and second field effect transistors having drain and source electrodes coupled in series between second ends of the pair of capacitors, with a first one of the drain and source electrodes of one of the field effect transistors coupled to a first one of the drain and source electrodes of the other field effect transistor;
(iii) a third field effect transistor, having drain and source electrodes, coupled betwen the common connection of the first pair of field effect transistors and a reference potential;
(iv) an inductive element having a pair of electrodes coupled between the common connection of the pair of field effect transistors and the reference potential;
(b) a second signal path comprising:
(i) a first pair of inductive elements, a first one having a first end coupled to the input terminal and the second one having a first end coupled to the output terminal;
(ii) a second pair of inductive elements, serially coupled together and serially coupled with the second ends of the first pair of inductive elements;
(iii) fourth and fifth field effect transistors, each one of said fourth and fifth transistors including drain and source electrodes coupled in shunt with a corresponding one of the second pair of inductive elements; and
(iv) a sixth field effect transistor, including drain and source electrodes, coupled between the common connection of the second pair of inductive elements and the reference potential.

5. The radio frequency network as recited in claim 4 wherein in repsonse to a pair of control signals fed to gate electrodes of each one of said field effect transistors, said transistors are switched to configure the first signal path and the second signal path to provide a first one of high and low pass filters.

6. The radio frequency circuit of claim 5 wherein the radio frequency network configured as a low pass filter has a first predetermined phase shift characteristic as a function of frequency over a predetermined frequency range and wherein the radio frequency network configured as a high pass filter has a second, different predetermined phase shift characteristic as a function of frequency over the predetermined frequency range.

7. The radio frequency circuit of claim 6 wherein the difference in phase between the network configured as a low pass filter and the network configured as a high pass filter is substantially constant over the predetermined frequency range.

8. A radio frequency network having an input terminal and an output terminal comprising:
two sets of field effect transistors, each set comprising three field effect transistors connected in a T-configuration, a pair of such field effect transistors in each set having a drain electrode of one transistor coupled to the source electrode of the other transistor of the pair to provide a series element of the T-configuration set, the third transistor of each set having drain and source electrodes with one of said electrodes coupled to the common connection of the pair of transistors and the other electrode coupled to a reference potential;
means for capacitively coupling a first one of the sets of the field effect transistors between the input terminal and the output terminal; and
means for inductively coupling a second one of the sets of the field effect transistors between the input terminal and the output terminal.

9. The radio frequency network as recited in claim 8 wherein a first control signal is fed to the series connected transistors of the first set of transistors and the reference potential connected transistor of the second set of transistors and a second control signal is fed to the series connected transistors of the second set of transistors and to the reference potential connected transistor of the first set of transistors.

10. The radio frequency network as recited in claim 9 wherein in response to the pair of control voltage signals, said field effect transistors are switched to configure the radio frequency network to provide a first one of a low and high pass filter.

11. The radio frequency network as recited in claim 10 wherein the radio frequency network configured as a low pass filter has a first predetermined phase shift characteristic as a function of frequency over a predetermined frequency range and wherein the radio frequency network configured as a high pass filter has a second, different predetermined phase shift characteristic as a function of frequency over the predetermined frequency range.

12. The radio frequency circuit of claim 11 wherein the difference in phase between the network configured as a low pass filter and the network configured as a high pass filter is substantially constant over the predetermined frequency range.

13. The radio frequency circuit of claim 9 wherein said pair of control signals are complementary control signals and wherein in response to a first state of said control signals the field effect transistors are switched to configure the radioi frequency network as a low pass filter and wherein in response to the second, different state of said control signals the transistors are switched to configure the radio frequency network as a high pass filter.

14. The radio frequency circuit of claim 13 whereing the radio frequency network configured as a low pass filter has a first predetermined phase shift characteristic as a function of frequency over a predetermined frequency range and wherein the radio frequency network configured as a high pass filter has a second, different, predetermined phase shift characteristic as a function of frequency over the predetermined frequency range.

15. The radio frequency circuit of claim 14 wherein the difference in phase between the network configured as a low pass filter and the network configured as a high pass filter is substantially constant over the predetermined frequency range.

* * * * *

UNITED STATES PATENT AND TRADEMARK OFFICE
CERTIFICATE OF CORRECTION

PATENT NO. : 4,733,203
DATED : March 22, 1988
INVENTOR(S) : Yalcin Ayasli

It is certified that error appears in the above-identified patent and that said Letters Patent is hereby corrected as shown below:

Column 3, line 13, delete "$D_6$" (second occurrence) and replace with --$S_6$--.

Column 7, line 15, delete "repsonse" and replace with --response--.

Column 7, line 29, delete "thrid" and replace with --third--.

Column 7, line 52, delete "th" and replace with --to--.

Column 8, line 19, delete "repsonse" and replace with --response--.

Column 9, line 19, delete "radioi" and replace with --radio--.

Column 10, line 5, delete "whereing" and replace with --wherein--.

Signed and Sealed this

Eighteenth Day of October, 1988

Attest:

DONALD J. QUIGG

Attesting Officer

Commissioner of Patents and Trademarks